US 9,184,261 B2

(12) United States Patent
Kobayashi et al.

(10) Patent No.: US 9,184,261 B2
(45) Date of Patent: Nov. 10, 2015

(54) SEMICONDUCTOR DEVICE HAVING FIELD PLATE ELECTRODE AND METHOD FOR MANUFACTURING THE SAME

(71) Applicant: KABUSHIKI KAISHA TOSHIBA, Tokyo (JP)

(72) Inventors: Hitoshi Kobayashi, Ishikawa (JP); Shigeki Tomita, Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 43 days.

(21) Appl. No.: 14/104,820

(22) Filed: Dec. 12, 2013

(65) Prior Publication Data
US 2014/0179094 A1    Jun. 26, 2014

Related U.S. Application Data

(62) Division of application No. 13/233,981, filed on Sep. 15, 2011, now abandoned.

(30) Foreign Application Priority Data

Feb. 9, 2011    (JP) .................................. 2011-025889

(51) Int. Cl.
*H01L 29/40*    (2006.01)
*H01L 29/66*    (2006.01)
*H01L 29/78*    (2006.01)
*H01L 29/06*    (2006.01)
*H01L 29/423*    (2006.01)

(52) U.S. Cl.
CPC ........ *H01L 29/66666* (2013.01); *H01L 29/407* (2013.01); *H01L 29/42376* (2013.01); *H01L 29/66734* (2013.01); *H01L 29/7813* (2013.01); *H01L 29/0649* (2013.01); *H01L 29/42368* (2013.01)

(58) Field of Classification Search
CPC .... H01L 29/401; H01L 29/404; H01L 29/407
See application file for complete search history.

(56) References Cited

U.S. PATENT DOCUMENTS 5,998,833 A    12/1999  Baliga
6,916,745 B2    7/2005  Herrick et al.
(Continued)

FOREIGN PATENT DOCUMENTS

JP    4-229662 A    8/1992
JP    2007165380 A    6/2007

OTHER PUBLICATIONS

Japanese Office Action dated Apr. 11, 2014, filed in Japanese counterpart Application No. 2011-025889, 4 pages. (with translation).

(Continued)

*Primary Examiner* — Jae Lee
(74) *Attorney, Agent, or Firm* — Patterson & Sheridan, LLP

(57) ABSTRACT

According to one embodiment, in a semiconductor device, a first semiconductor layer of a first conductivity type has a first impurity concentration. A second semiconductor layer of the first conductivity type is formed on the first semiconductor layer and has a second impurity concentration lower than the first impurity concentration. A field plate electrode is formed in a lower portion of a trench formed in the second semiconductor layer through a first insulating film so as to bury the lower portion of the trench. A second insulating film is formed in the upper portion of the trench so as to be in contact with the top surface of the field plate electrode. A gate electrode is formed in the upper portion of the trench through a gate insulating film so as to bury the upper portion of the trench to sandwich the second insulating film.

7 Claims, 13 Drawing Sheets

(56) References Cited

U.S. PATENT DOCUMENTS

| | | |
|---|---|---|
| 7,344,943 B2 | 3/2008 | Herrick et al. |
| 2007/0138547 A1 | 6/2007 | Nakamura |
| 2008/0199997 A1 | 8/2008 | Grebs et al. |
| 2009/0152624 A1* | 6/2009 | Hiller et al. .................. 257/330 |

OTHER PUBLICATIONS

Japanese Office Action dated Jun. 13, 2014, filed in Japanese counterpart Application No. 2011-025889, 4 pages (with translation).

* cited by examiner $Ciss = Cgd + Cgs + (Cgs1 + Cgs2)$

SEMICONDUCTOR DEVICE HAVING FIELD PLATE ELECTRODE AND METHOD FOR MANUFACTURING THE SAME

CROSS REFERENCE TO RELATED APPLICATION

This application is a division of U.S. patent application Ser. No. 13/233,981, filed on Sep. 15, 2011, which is based upon and claims the benefit of priority from the prior Japanese Patent Application No. 2011-025889, filed on Feb. 9, 2011, the entire contents of each of which are incorporated herein by reference.

FIELD

Embodiments described herein relate generally to a semiconductor device having a field plate electrode and a method for manufacturing the semiconductor device.

BACKGROUND

A power semiconductor device requires a high withstand voltage and a high figure of merit (FOM: Figure Of Merit). The figure of merit is under the control of a conduction loss due to an on-resistance and a switching loss in a turn-on state, and is expressed by an inverse number of a product of an on-resistance Ron and an input capacitance Ciss (Source Short-circuit Input Capacitance). In general, the on-resistance Ron and the input capacitance Ciss are traded off.

As a conventional power semiconductor device, an insulating gate field effect transistor of which the electric field concentration is moderated by a vertical field plate structure to achieve a high withstand voltage is known.

In the semiconductor device, a trench is formed in an N-type semiconductor layer on a drain layer. A field plate electrode is buried into the trench through a thick field plate insulating film. The field plate electrode is electrically connected to a source layer.

A gate electrode is buried into an upper portion of the trench through a gate insulating film to sandwich the field plate electrode through an insulating film. A P-type base layer is formed on an upper portion of an N-type semiconductor layer adjacent to the trench, and an N-type source layer is formed on the upper portion of the base layer.

As a result, it is a problem in that an input capacitance Ciss increases due to an increase of an inter-electrode capacitance between the gate electrode and the field plate electrode increases. For this reason, it is a problem that it is impossible to obtain a high figure of merit due to an increase of a product of the on-resistance Ron and the input capacitance Ciss.

DETAILED DESCRIPTION

Figure 1:
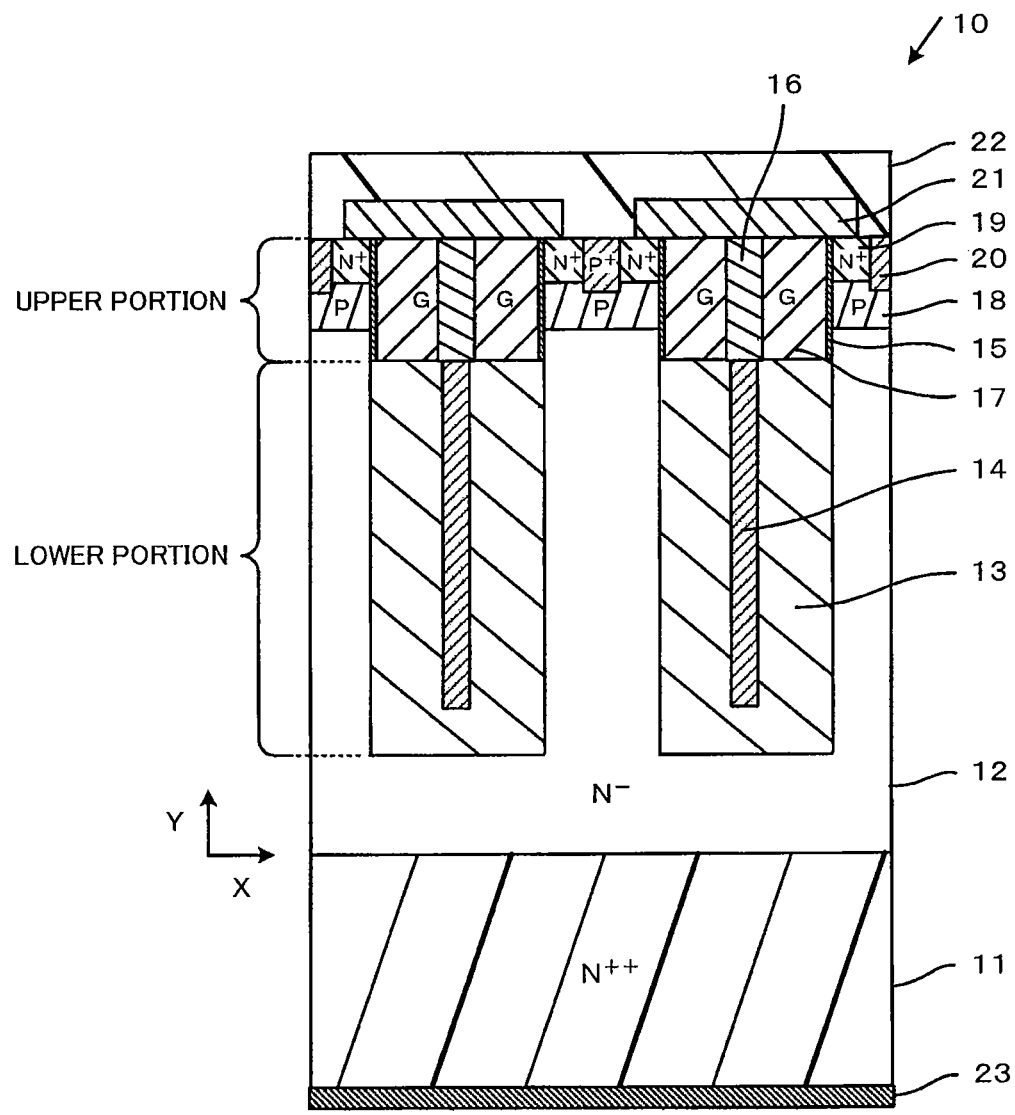
FIG. 1 is a cross-sectional view showing a semiconductor device according to an embodiment.

According to one embodiment, in a semiconductor device, a first semiconductor layer of a first conductivity type has a first impurity concentration. A second semiconductor layer of the first conductivity type is formed on the first semiconductor layer and has a second impurity concentration lower than the first impurity concentration. A field plate electrode is formed in a lower portion of a trench formed in the second semiconductor layer on a bottom surface side of the trench through a first insulating film so as to bury the lower portion of the trench. A second insulating film is formed in the upper portion of the trench so as to be in contact with the top surface of the field plate electrode. A gate electrode is formed in the upper portion of the trench on an opening side of the trench through a gate insulating film so as to bury the upper portion of the trench to sandwich the second insulating film. A base layer of a second conductivity type is formed in the upper portion of the second semiconductor layer and has a third impurity concentration. A source layer of the first conductivity type is formed in the upper portion of the base layer and has a fourth impurity concentration higher than the second impurity concentration.

Hereinafter, embodiments will be described with reference to the drawings. In the drawings, same reference characters denote the same or similar portions.

Embodiment

Figure 2A:
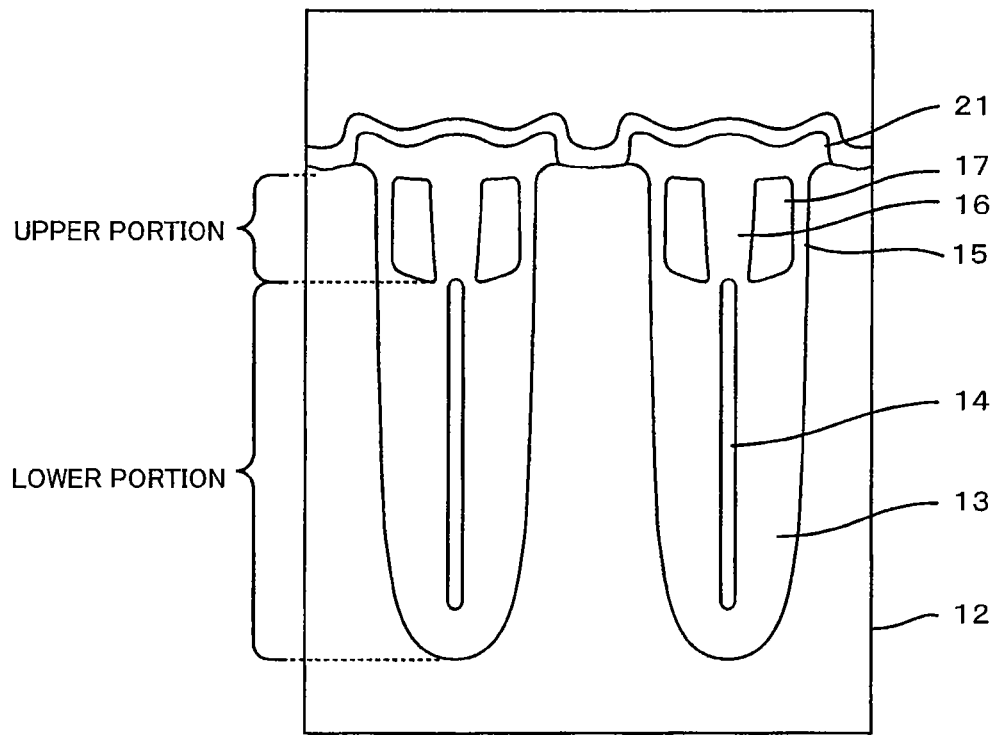
FIGS. 2A and 2B are cross-sectional images of scanning electron microscope showing the semiconductor device according to the embodiment.
Figure 2B:
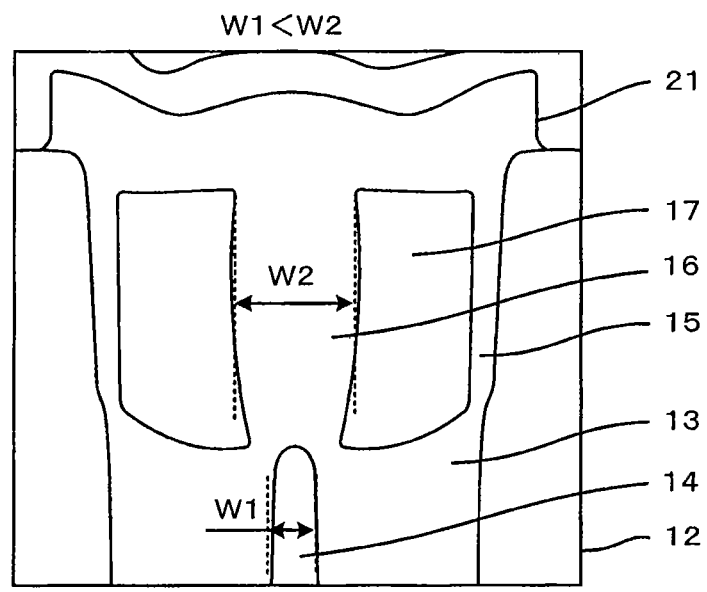

A semiconductor device of an embodiment will be described with reference to FIGS. 1 to 2B. FIG. 1 is a cross-sectional view showing the semiconductor device, and FIGS. 2A and 2B are cross-sectional SEM (Scanning Electron Microscope) images showing the semiconductor device. The semiconductor device of the embodiment is a trench gate field effect transistor having a vertical field plate structure.

As shown in FIGS. 1 to 2B, in a semiconductor device 10 of the embodiment, a second semiconductor layer 12 of a first conductivity type ($N^-$-type) having a second impurity concentration lower than a first impurity concentration is formed on a first semiconductor layer 11 of a first conductivity type ($N^{++}$-type) having the first impurity concentration.

The first semiconductor layer 11 serves as a drain layer and is a silicon substrate, for example. The first impurity concentration and the thickness of the first semiconductor layer 11 are about 2E19 $cm^{-3}$ and about 100 μm, for example, respectively.

The second semiconductor layer 12 is a drift layer in which electrons run, and is a silicon layer formed by epitaxial growth on the first semiconductor layer 11, for example. The second impurity concentration and the thickness of the second semiconductor layer 12 depend on the withstand voltage of the semiconductor device 10. When a withstand voltage of 100 V, for example, is obtained, the second impurity concentration and the thickness are about 2E16 $cm^{-3}$ and about 7.5 μm, respectively.

In the second semiconductor layer 12, a stripe shaped trench having a width of about 1.7 μm and a depth of about 5

μm, for example, is formed in a depth direction (vertical direction to the drawing). The multiple trenches are aligned in a lateral direction (X direction on the drawing) with a predetermined pitch of about 3 μm, for example.

In the trench, a field plate structure is formed in a lower portion of the trench on a bottom surface side of the trench. A trench gate structure is formed in an upper portion of the trench on an opening side of the trench.

More specifically, a thick first insulating film (field plate insulating film) 13 is formed on an inner surface of the lower portion of the trench. A field plate electrode 14 is formed to bury the lower portion of the trench through the first insulating film 13.

The first insulating film 13 is a silicon oxide film having a thickness of about 0.67 μm, for example. The field plate electrode 14 is a polysilicon film having a width W1 of about 0.42 μm for example and doped with a phosphorous (P), for example, serving as an impurity at about $1E18\ cm^{-3}$. The first insulating film 13 and the field plate electrode 14 are formed from a bottom surface of the trench at a height of about 4.5 μm, for example.

In the field plate structure, a thick insulating film is formed in the trench to make it possible to keep an electric field in a breakdown state from a junction to the bottom of the trench to moderate the electric field acting on the junction.

Furthermore, a gate insulating film 15 is formed on a side surface of the upper portion of the trench. A gate electrode 17 is formed through the gate insulating film 15 so as to bury the upper portion of the trench to sandwich a second insulating film 16.

An upper surface of the first insulating film 13 and a lower surface of the gate electrode 17 are in contact with each other. An upper surface of the field plate electrode 14 and a lower surface of the second insulating film 16 are in contact with each other. An upper surface of the second insulating film 16 and an upper surface of the second semiconductor layer 12 are substantially on the same plane. A width W2 of the second insulating film 16 is larger than a width W1 of the field plate electrode 14, and is about 0.6 μm for example (W1<W2).

The gate insulating film 15 is a thin silicon oxide film having a thickness of about 75 nm and obtained by thermally oxidizing side surfaces of the upper portion of the trench as will be described later. The gate electrode 17 is a polysilicon film doped with P, for example.

The second insulating film 16 is a silicon oxide film obtained by thermally oxidizing an entire area of the upper portion of the field plate electrode 14. Therefore, in the second insulating film 16, as in the field plate electrode 14, P is doped in the polysilicon film. However, a concentration of P in the second insulating film 16 lower than a concentration of P in the field plate electrode 14 depending on an increase in volume by oxidation.

Since thermal oxidation also extends to the field plate electrode 14 that is not exposed from the first insulating film 13, an interface between the second insulating film 16 and the field plate electrode 14 is present to be slightly closer to the first semiconductor layer 11 than the upper surface of the first insulating film 13.

A base layer (a third semiconductor layer) 18 of a second conductivity type (P-type) having a third impurity concentration is formed on an upper portion of the second semiconductor layer 12 adjacent to the trench.

A source layer (a fourth semiconductor layer) 19 of a first conductivity type ($N^+$-type) having a fourth impurity concentration higher than the second impurity concentration is formed on the upper portion of the base layer 18.

A voltage is applied to the gate electrode 17 to form a channel in the base layer 18 immediately under the gate electrode 17, so that the source layer 19 and the first semiconductor layer 11 are electrically connected to each other.

A fifth semiconductor layer 20 of a second conductivity type ($P^+$-type) having a fourth impurity concentration higher than the third impurity concentration is formed at a central portion of the source layer 19 to reach the base layer 18 through the source layer 19.

The fifth semiconductor layer 20 is a carrier discharging layer that is formed to discharge carriers (holes) generated in the second semiconductor layer 12 when a PN junction between the base layer 18 and the second semiconductor layer 12 breaks down during operation.

When the junction is broken down and carriers are not well discharged, heat is generated with movement of the carriers, and the semiconductor device 10 may be thermally broken. For this reason, in addition to the source layer 19, the fifth semiconductor layer 20 to discharge carriers is formed on an upper portion of the base layer 18 to make it difficult to thermally break the semiconductor device 10. More specifically, an avalanche resistance is improved.

An interlayer insulating film 21, a silicon oxide film, for example, is formed on portions of the second insulating film 16, the gate electrode 17, and the source layer 19.

A source metal 22, aluminum (Al), for example, that is in contact with the source layer 19 and the fifth semiconductor layer 20 is formed on the interlayer insulating film 21 to cover the interlayer insulating film 21.

In the first semiconductor layer 11, a drain metal 23, a gold-germanium alloy (AuGe), for example, is formed on a surface side facing the second semiconductor layer 12.

The semiconductor device 10 of the embodiment is configured to moderate electric field concentration in the second semiconductor layer 12 with a vertical field plate structure including the first insulating film 13 and the field plate electrode 14 to obtain a high withstand voltage and to reduce a naturally increasing capacitance between the gate electrode 17 and the field plate electrode 14 with the field plate structure.

Accordingly, since an input capacitance Ciss decreases, a product of an on-resistance Ron and the input capacitance Ciss decreases to make it possible to increase a figure of merit.

Comparative Example

Figure 12:
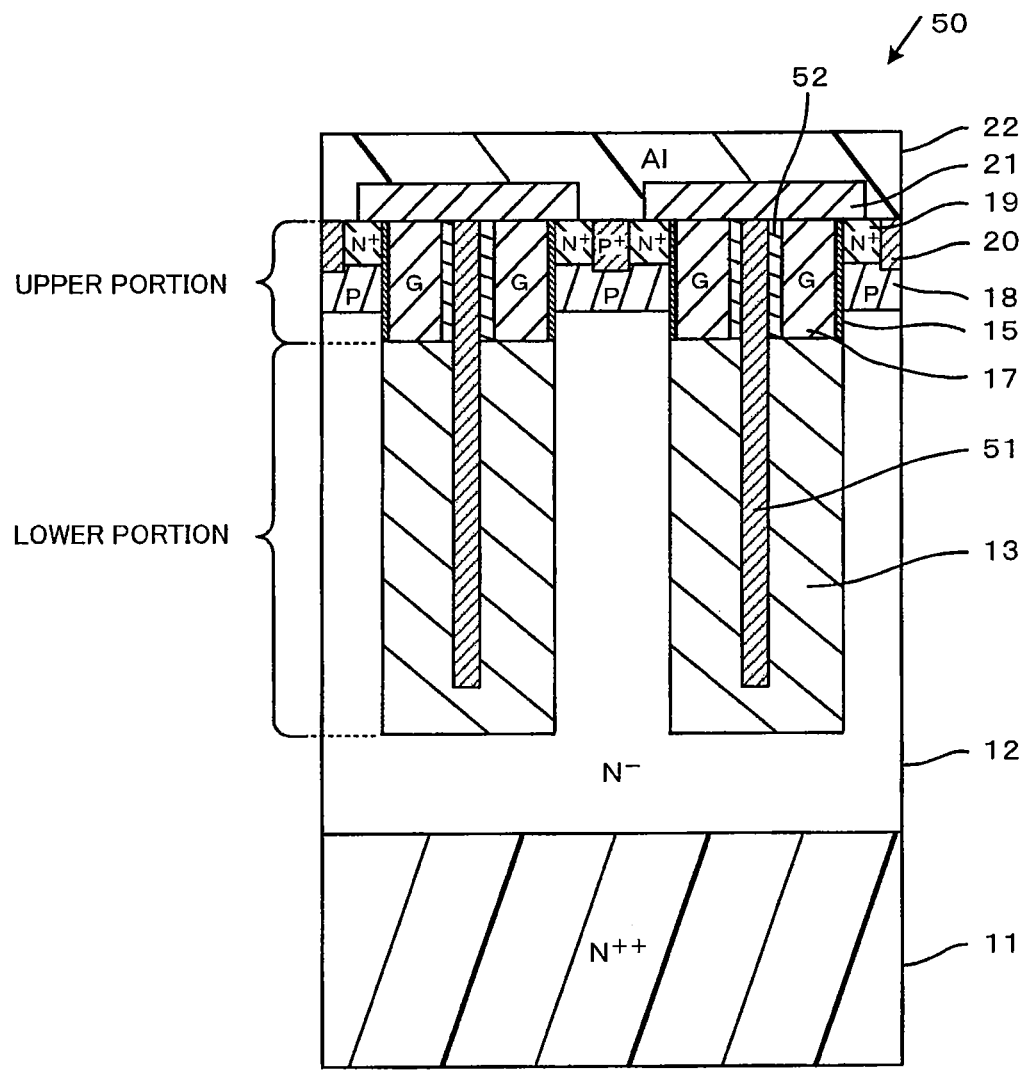
FIG. 12 is a cross-sectional view showing a semiconductor device of a comparative example according to the embodiment.
Figure 13A:
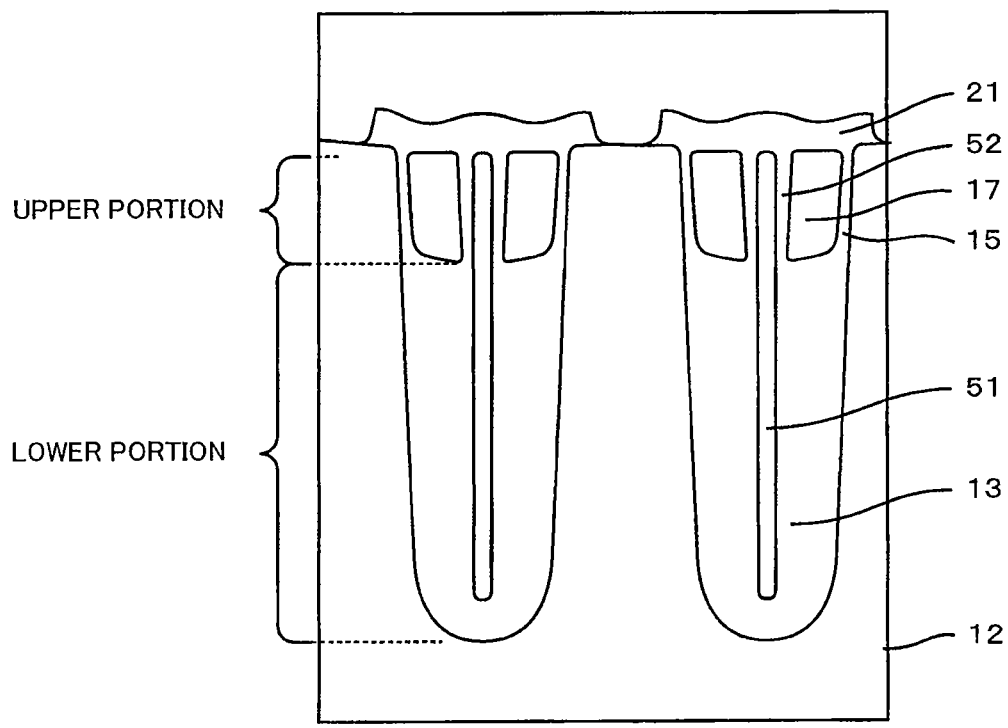
FIGS. 13A and 13B are cross-sectional images of scanning electron microscope showing the semiconductor device of the comparative example according to the embodiment.
Figure 13B:
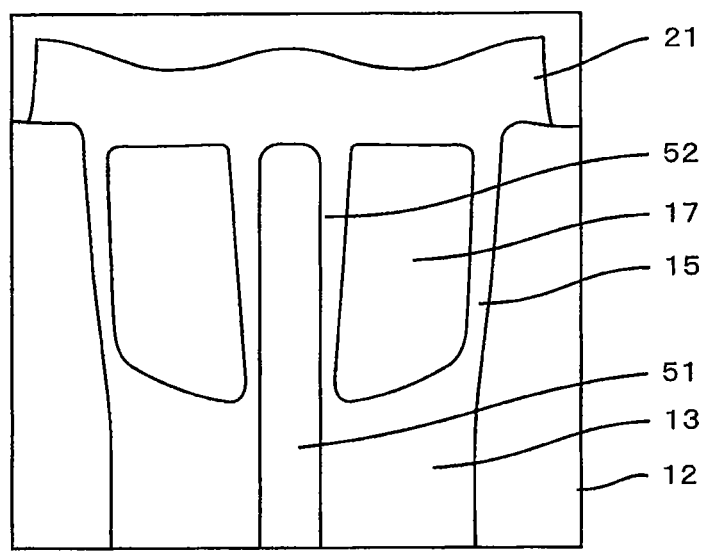

FIG. 12 is a cross-sectional view of a semiconductor device 50 of a comparative example, and FIG. 13 is a cross-sectional SEM image of the semiconductor device 50 of the comparative example.

As shown in FIGS. 12 and 13, in the semiconductor device 50 of the comparative example, a field plate electrode 51 is formed from a lower portion of a trench to an upper portion of the trench. The gate electrode 17 is formed on the upper portion of the trench through the gate insulating film 15 to sandwich the upper portion of the field plate electrode 51 through an insulating film 52.

Figure 3:
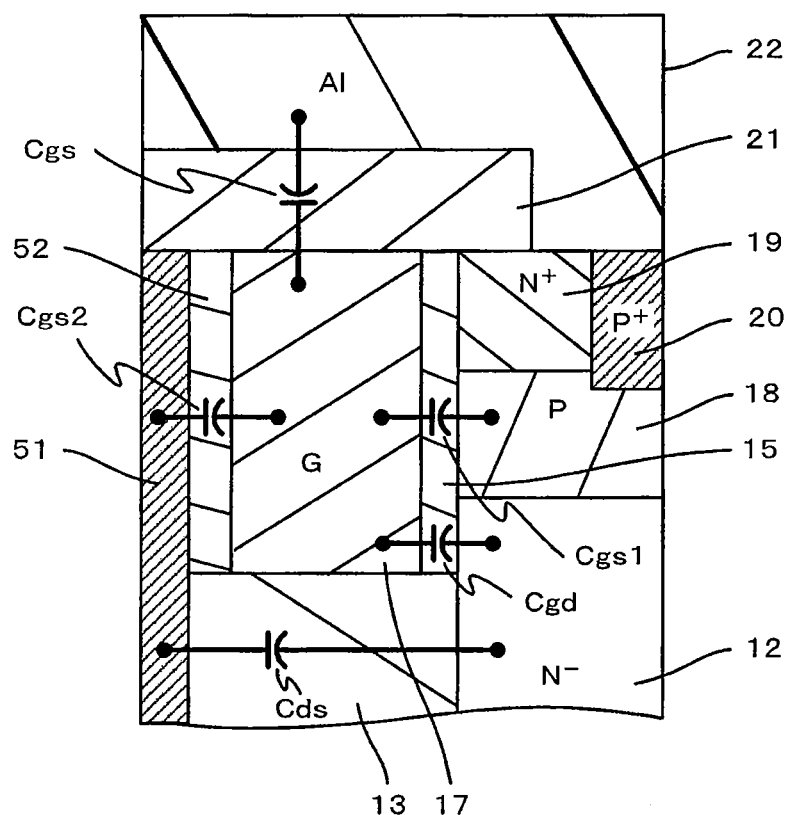
FIG. 3 is a view to explain an input capacitance of the semiconductor device according to the embodiment.

FIG. 3 shows an inter-electrode capacitance generated in the semiconductor device 50 of the comparative example, i.e., the input capacitance Ciss. In general, inter-electrode capacitances include a capacitance Cgd between the gate electrode 17 and the second semiconductor layer 12, a capacitance Cgs between the gate electrode 17 and the source metal 22, a capacitance Cds between the field plate electrode 51 and the second semiconductor layer 12, a capacitance Cgs1 of an inversion layer of a channel, and a capacitance Cgs2 between the gate electrode 17 and the field plate electrode 51.

At this time, the input capacitance Ciss is expressed by a sum of the capacitance Cgd, the capacitance Cgs, the capacitance Cgs1, and the capacitance Cgs2, and given by Ciss=Cgd+Cgs+(Cgs1+Cgs2).

The capacitance Cgs1 and the capacitance Cgd depend on the thickness of the gate insulating film 15. Since the thickness of the gate insulating film 15 is uniquely determined in accordance with a threshold value, the capacitance Cgs1 and the capacitance Cgd cannot be set up arbitrarily, but take constant values.

The capacitance Cgs depends on a thickness of the interlayer insulating film 21. Since the thickness of the interlayer insulating film 21 is sufficiently larger than that of the gate insulating film 15, the capacitance Cgs is sufficiently small. Subsequently, it is assumed that the capacitance Cgs can be neglected.

Figure 4:
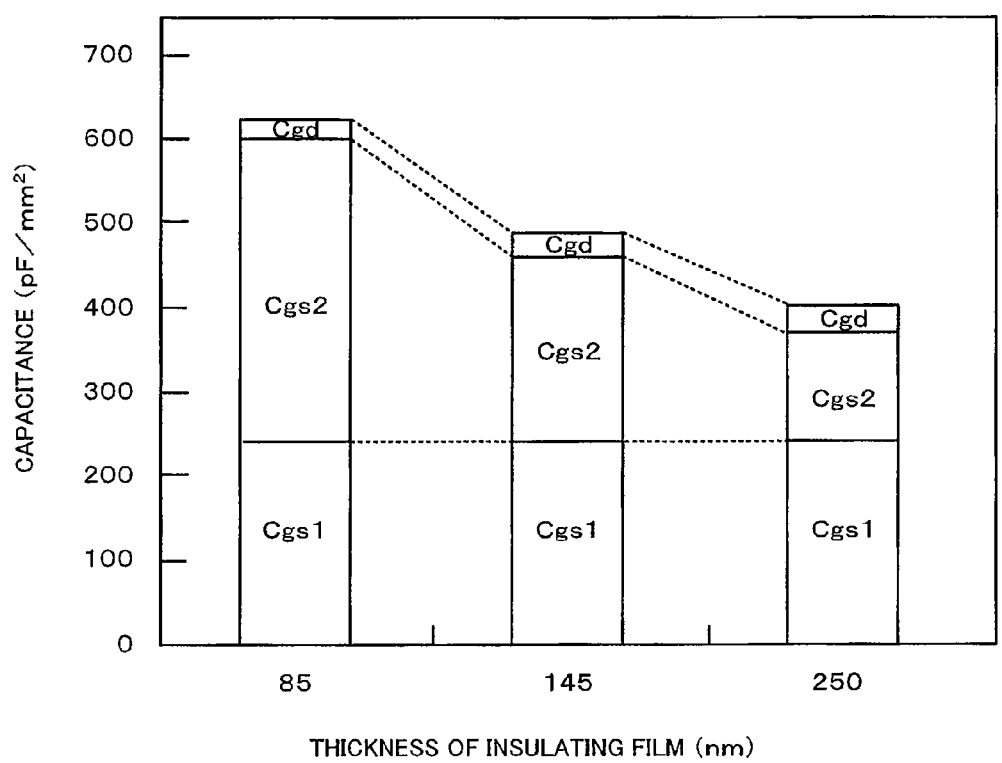
FIG. 4 is a diagram showing a simulation result of the input capacitance of the semiconductor device according to the embodiment.

The capacitance Cgs2 depends on a thickness of the insulating film 52. When the insulating film 52 is increased in thickness, the capacitance Cgs2 decreases. FIG. 4 is a diagram showing a result obtained by simulating a relationship between the input capacitance Ciss and the thickness of the insulating film 52.

As shown in FIG. 4, ratios of the capacitance Cgs1 and the capacitance Cgs2 to the input capacitance Ciss are large, and a ratio of the capacitance Cgd to the input capacitance Ciss is small. When the thickness of the insulating film 52 is increased to 85 nm, 145 nm, and 250 nm in the order, the capacitance Cgs2 decreases. However, as described above, the capacitance Cgs1 and the capacitance Cgd do not change. This is because the thickness of the gate insulating film 15 is constant.

Therefore, in order to improve the figure of merit, the thickness of the insulating film 52 is desirably increased in thickness as much as possible to reduce the capacitance Cgs2. This is because the thickness of the insulating film 52 does not influence a withstand voltage and the on-resistance Ron.

In order to increase the insulating film 52 in thickness, the upper portion of the field plate electrode 51 facing the gate electrode 17 is desirably thinned to be zero in the ultimate sense. This is because, since the field plate electrode 51 is continuously electrically connected to the source layer 19 without the upper portion, the field plate electrode 51 cannot disturb the function of the field plate structure. On the other hand, a decrease in thickness of the gate electrode 17 is not desired because the gate resistance increases.

Since the capacitance Cds between the field plate electrode 51 and the second semiconductor layer 12 does not directly influence the figure of merit, a description of the capacitance Cds will be omitted.

In the semiconductor device 10 of the embodiment, since the field plate electrode 14 of which the upper portion is eliminated is realized, the capacitance Cgs2 can be made a sufficiently small value that is negligible. Accordingly, the input capacitance Ciss decreases, and the product of the on-resistance Ron and the input capacitance Ciss decreases to make it possible to increase the figure of merit.

A method for manufacturing the semiconductor device 10 will be described. FIGS. 5A to 10B are cross-sectional views sequentially showing the steps of manufacturing the semiconductor device 10.

Figure 5A:
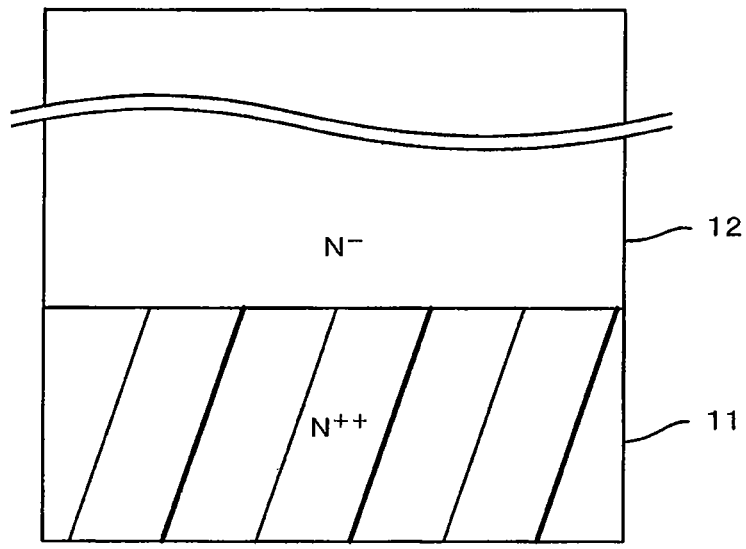
FIGS. 5A to 10B are cross-sectional views sequentially showing the steps of manufacturing the semiconductor device according to the embodiment.

As shown in FIG. 5A, the second semiconductor layer 12 is formed on the first semiconductor layer 11 by vapor phase growth. More specifically, dichlorosilane ($SiH_2Cl_2$) is used as a process gas, for example, a phosphine ($PH_3$) is used as a dopant gas, and hydrogen ($H_2$) is used as a carrier gas. The second semiconductor layer 12 is epitaxially grown on the first semiconductor layer 11 at a temperature of 1000° C.

Figure 5B:
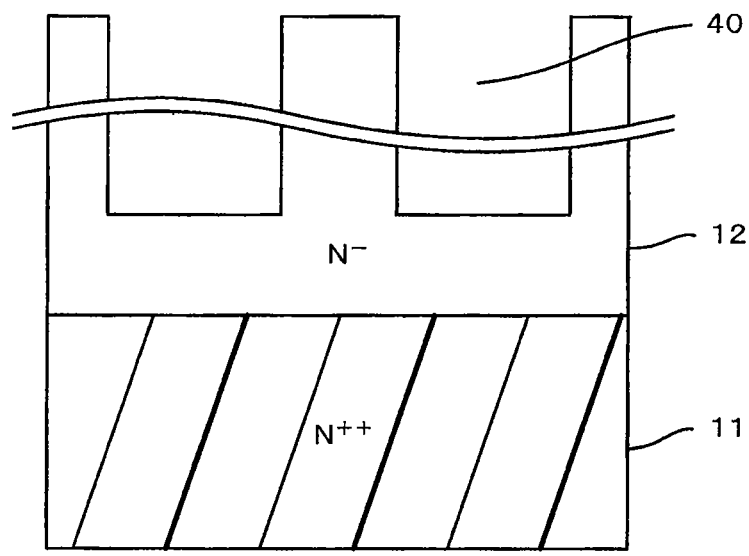

As shown in FIG. 5B, a mask material (not shown) having a stripe shaped opening is formed on the second semiconductor layer 12, and the second semiconductor layer 12 is anisotropically etched by a RIE (Reactive Ion Etching) method using a fluorine-based gas, for example, to form a trench 40.

Figure 6A:
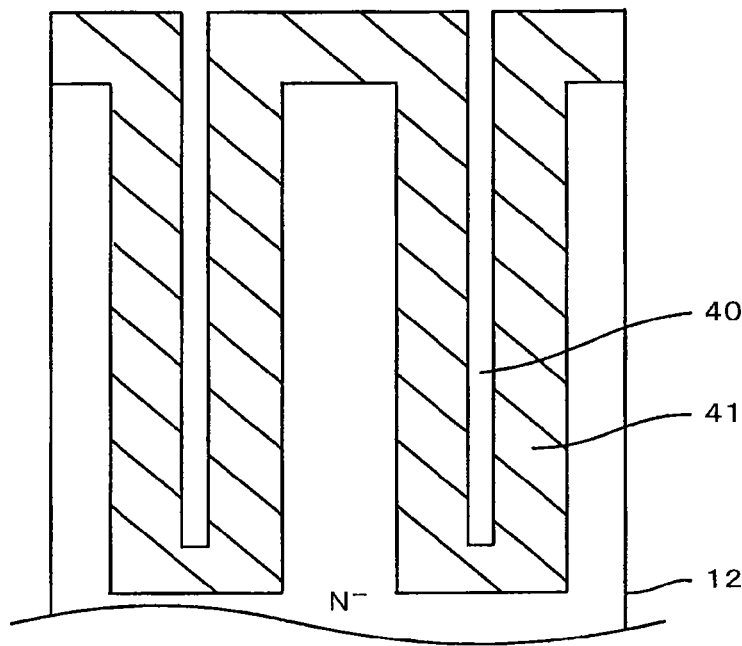

As shown in FIG. 6A, a silicon oxide film 41 is conformally formed on an internal surface of the trench 40 by a CVD (Chemical Vapor Deposition) method, for example. The silicon oxide film 41 serves as the first insulating film 13 in the subsequent steps.

Figure 6B:
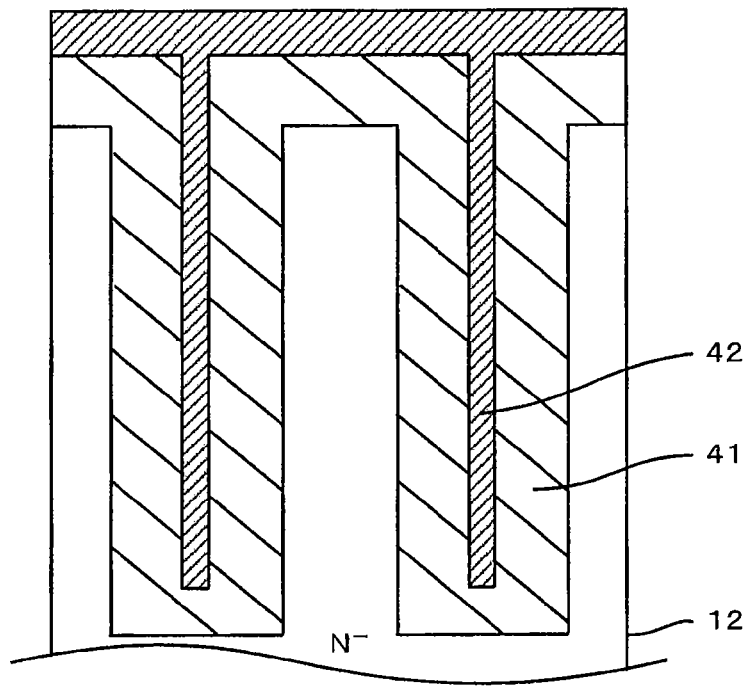

As shown in FIG. 6B, a polysilicon film 42 doped with P is formed by a CVD method, for example, to bury the trench 40 through the silicon oxide film 41. The polysilicon film 42 serves as the field plate electrode 14 in the subsequent steps.

Figure 7A:
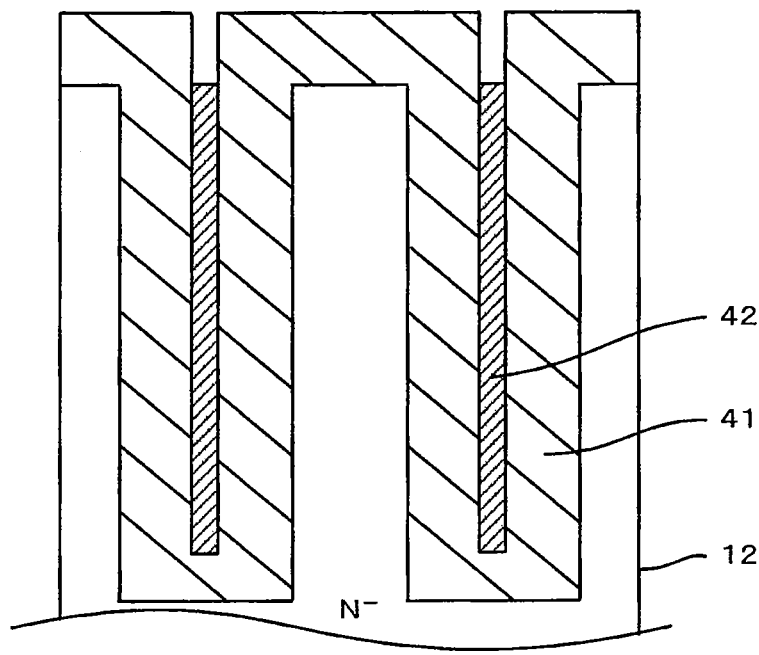

As shown in FIG. 7A, the polysilicon film 42 is anisotropically etched by an RIE method using a chlorine-based gas and fluorine-based gas, for example. The anisotropic etching is performed until the upper surface of the polysilicon film 42 and the upper surface of the second semiconductor layer 12 are at substantially the same level.

Figure 7B:
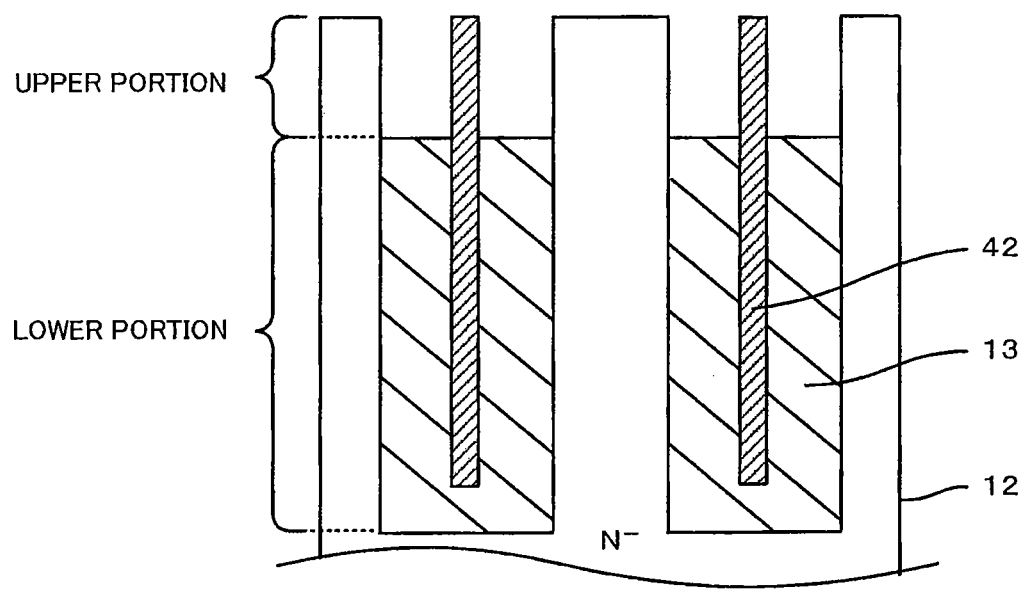

As shown in FIG. 7B, the silicon oxide film 41 is anisotropically etched by an RIE method using a fluorine-based gas, for example. The anisotropic etching is performed until the upper portion of the trench and the upper portion of the polysilicon film 42 are exposed. The silicon oxide film 41 that is not anisotropically etched serves as the first insulating film 13.

Figure 8A:
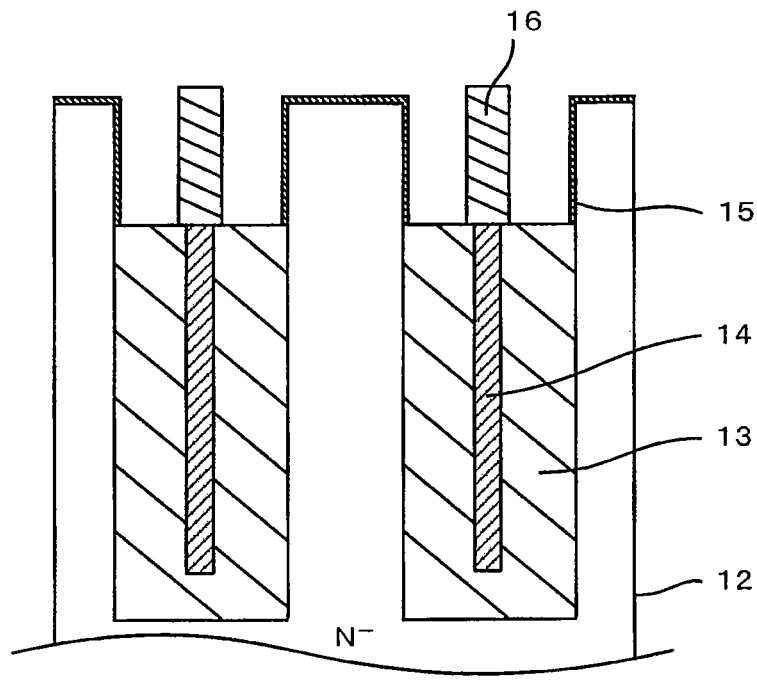
Figure 8B:
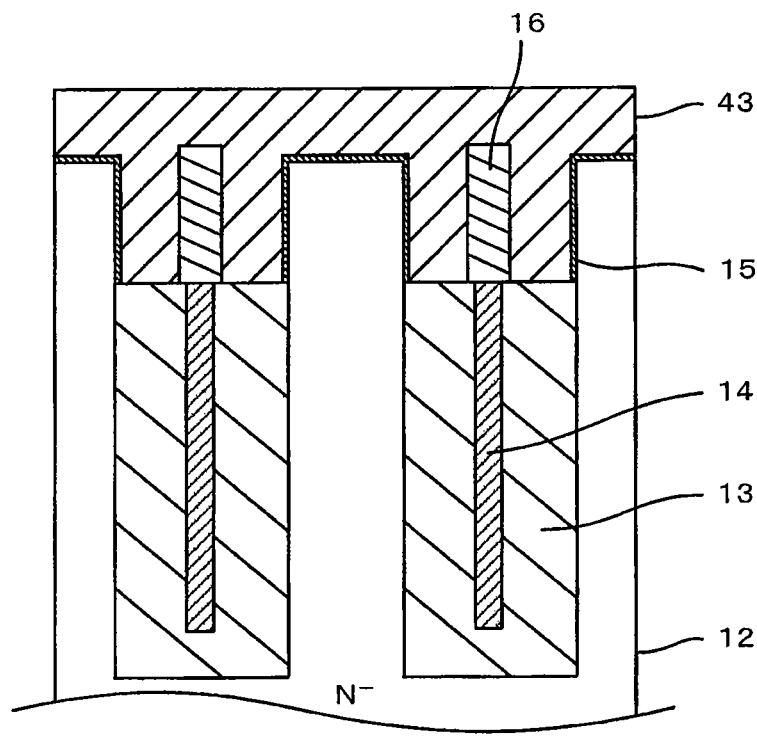

As shown in FIG. 8A, the upper portion of the exposed trench and the upper portion of the exposed polysilicon film 42 are thermally oxidized. The thermal oxidization is performed under a condition in which enhanced oxidation of the polysilicon film 42 easily occurs by low-temperature hydrogen burning oxidation, for example.

The hydrogen burning oxidation is an oxidizing method that performs oxidization in a wet atmosphere containing water vapor generated by burning hydrogen. The hydrogen burning oxidation is advantageously cleaner more than steam oxidation that generates water vapor by using a water bubbler, and advantageously obtains controllability higher than that of the steam oxidation.

Figure 11:
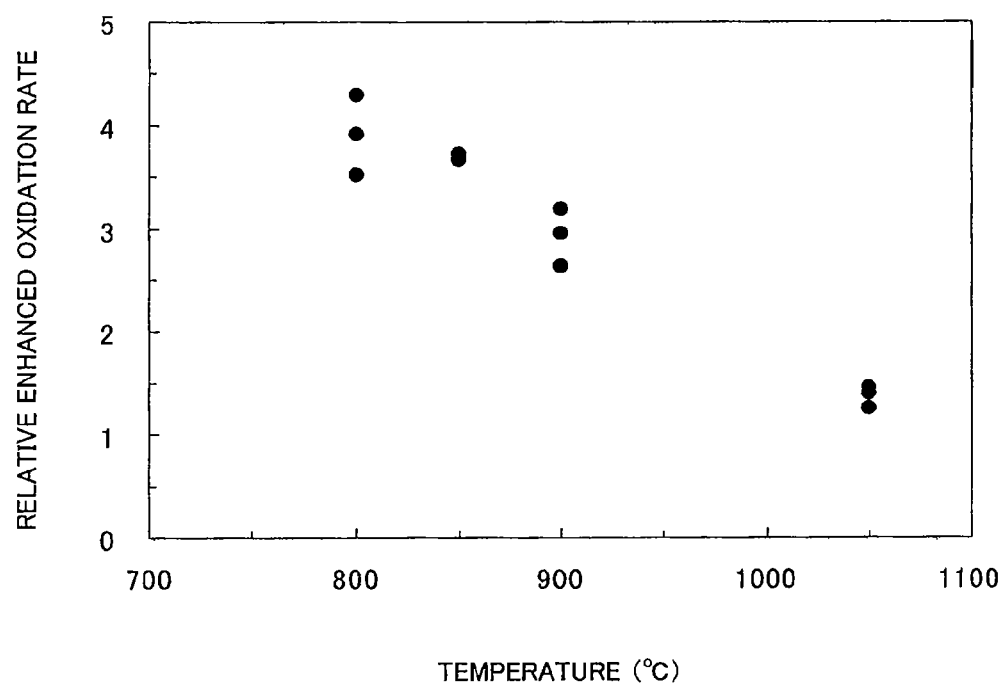
FIG. 11 is a diagram showing a relation between a temperature and a relative enhanced oxidation rate.

Referring to FIG. 11, enhanced oxidation in the hydrogen burning oxidation will be described. FIG. 11 is a diagram showing an example of a relation between a temperature and a relative enhanced oxidation rate (a ratio of an oxidation rate of the polysilicon film 42 to an oxidation rate of a side surface of the trench 40).

As shown in FIG. 11, in the low-temperature hydrogen burning oxidation at a temperature of about 800° C. to about 900° C., polysilicon doped with P at a high concentration is oxidized at a rate about 2.5 to 4.5 times higher than the oxidation rate of silicon. Upper and lower plots show fluctuations in the relative enhanced oxidation rate. On the other hand, when a temperature becomes high, the relative enhanced oxidation rate decreases. At a temperature of 1050° C., the ratio decreases to 1.5 times or less.

The relative enhanced oxidation rate increases at a low temperature because activation energy of silicon to thermal oxidation is higher than activation energy of polysilicon. More specifically, this is because, when the temperature becomes low, an oxidation rate of silicon sharply decreases, and an oxidation rate of polysilicon moderately decreases.

As a result, the thin gate insulating film 15 is formed on an upper side surface of the exposed trench. The upper portion of the exposed polysilicon film 42 is entirely oxidized and modified into the second insulating film 16 having a thickness that is about 1.4 times larger than that of the original polysilicon film 42. The unexposed lower polysilicon film 42 serves as the field plate electrode 14.

Since the enhanced oxidation extends from the first insulating film 13 to the unexposed polysilicon film 42, an interface between the second insulating film 16 and the field plate electrode 14 is present to be slightly closer to the bottom surface side of the trench 40 than the upper surface of the first insulating film 13.

Therefore, the hydrogen burning oxidation may be performed simultaneously with the oxidation of the entire upper portion of the polysilicon film 42 or may be performed under an enhanced oxidation condition that obtains the gate insulating film 15 having a target thickness after the oxidation of the entire upper portion of the polysilicon film 42. In order to obtain the second insulating film 16 having a thickness of about 0.6 µm, for example, and the gate insulating film 15 having a thickness of about 75 nm, the enhanced oxidation condition is set such that the relative enhanced oxidation rate is 4 or more.

Returning to FIG. 8B, the second insulating film 16 is covered by a CVD method, for example, and a polysilicon film 43 doped with P is formed to bury the upper portion of the exposed trench. The polysilicon film 43 serves as the gate electrode 17 in the subsequent steps.

Figure 9A:
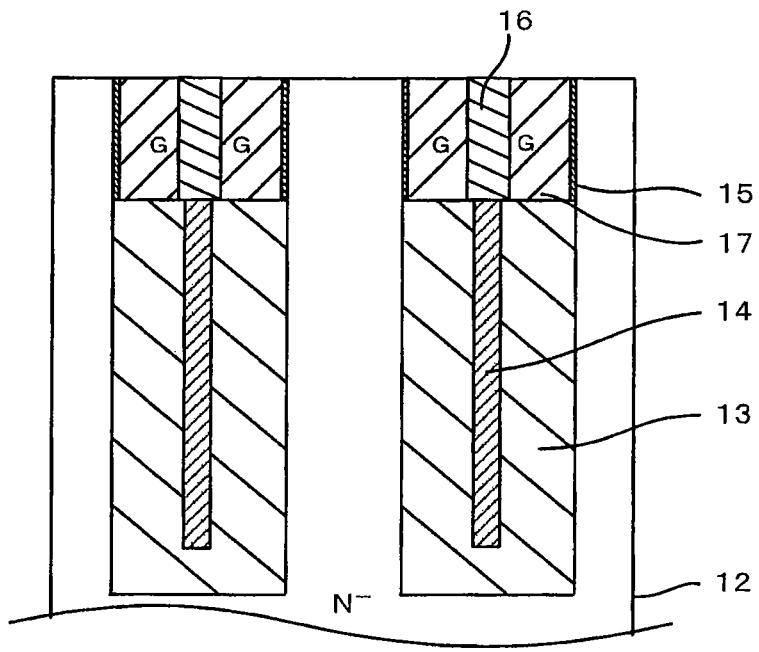

As shown in FIG. 9A, the polysilicon film 43 is removed by a CDE (Chemical Dry Etching) method using a fluorine-based gas, for example or a CMP (Chemical Mechanical Polishing) method, until the upper surface of the second semiconductor layer 12 is exposed. The polysilicon film 43 which is not removed serves as the gate electrode 17.

In this manner, the gate electrode 17 buried into the upper portion of the trench through the gate insulating film 15 to sandwich the second insulating film 16 is formed.

Figure 9B:
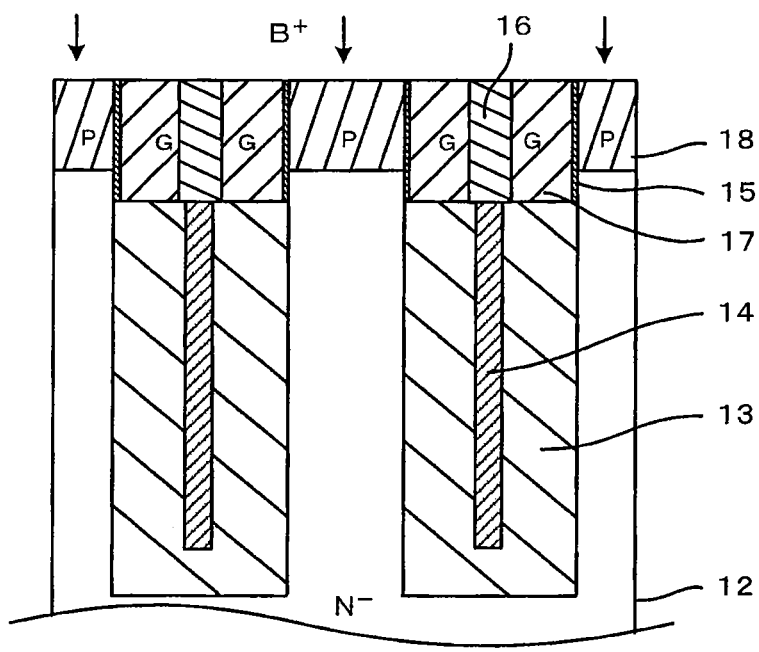

As shown in FIG. 9B, after a mask material (not shown) having an opening that exposes the second semiconductor layer 12 is formed, boron (B) is ion-implanted in the second semiconductor layer 12 to form the base layer 18 on the upper portion of the second semiconductor layer 12.

Figure 10A:
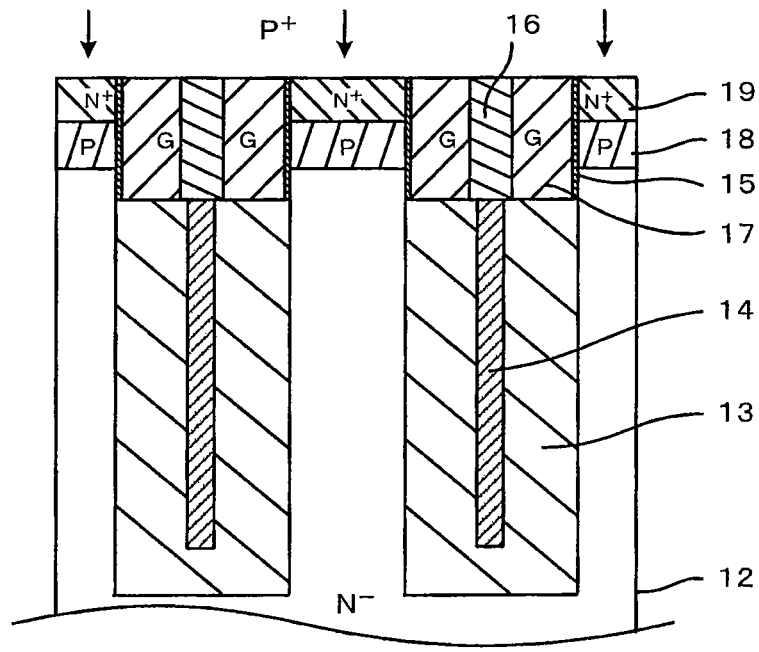

As shown in FIG. 10A, after a mask material (not shown) having an opening that exposes the base layer 18 is formed, P is ion-implanted in the base layer 18 to form the source layer 19 on the upper portion of the base layer 18.

Figure 10B:
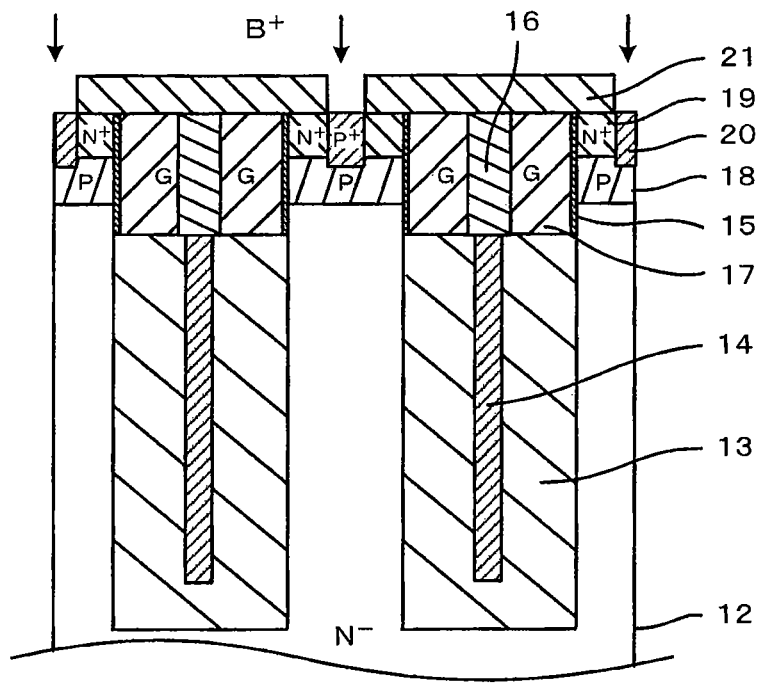

As shown in FIG. 10B, the interlayer insulating film 21 having an opening that exposes a central portion of the source layer 19, a silicon oxide film obtained by a CVD method, for example, is formed. B is ion-implanted in the central portion of the source layer 19 by using the interlayer insulating film 21 as a mask, and the fifth semiconductor layer 20 that reaches the base layer 18 through the source layer 19 is formed.

As the source metal 22, an Al film that covers the interlayer insulating film 21 and are in contact with the source layer 19 and the fifth semiconductor layer 20 is formed by a sputtering method, for example. As the drain metal 23, an AuGe alloy film is formed on a surface of the first semiconductor layer 11 facing the second semiconductor layer 12 by an evaporation method, for example. In this manner, the semiconductor device 10 shown in FIG. 1 is obtained.

As described above, in the embodiment, the field plate electrode 14 buried into the lower portion of the trench through the first insulating film 13 is formed, and the gate electrode 17 buried into the upper portion of the trench through the gate insulating film 15 to sandwich the second insulating film 16 is formed.

As a result, the capacitance Cgs2 between the field plate electrode 14 and the gate electrode 17 decreases. When the input capacitance Ciss decreases, the product of the on-resistance Ron and the input capacitance Ciss becomes small so as to increase the figure of merit. Therefore, a semiconductor device which reduces a capacitance between a gate electrode and a field plate electrode is and a method for manufacturing the semiconductor device can be obtained.

When the semiconductor device 10 shown in FIG. 1 is used as a semiconductor device to which a high withstand voltage of 100 V to 200 V, for example, is applied, the following effect can be obtained. Although a trench width of a high-withstand voltage semiconductor device is designed to 1 to 2.5 µm, the trench width is larger than that of a low-withstand voltage semiconductor device. For this reason, in a high-withstand voltage semiconductor device that does not include the second insulating film 16, the polysilicon film 43 having an overwhelming film thickness needs to be formed on the field plate electrode 14 to bury the upper portion of the trench with the gate electrode 17. In the embodiment, the upper portion of the field plate electrode 14 is covered with the second insulating film 16, and the field plate electrode 14 is formed at a position lower than the gate electrode 17. For this reason, the trench is advantageously buried and filled.

In the specification, the description is given of the case where the first conductive type and the second conductive type are an N type and a P type, respectively. However, the first conductive type and the second conductive type may be a P type and an N type, respectively.

The description is given of the case where thermal oxidation of the upper portion of the exposed trench and the upper portion of the exposed poly silicon film 42 is performed by hydrogen burning oxidation. However, any condition in which enhanced oxidation of the polysilicon film 42 is performed may be used to obtain the target gate insulating film 15 and the target second insulating film 16. The thermal oxidation can also be performed by another method, steam oxidation, for example.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the devices described herein may be made without departing from the spirit of the inventions. The accompanying claims and their equivalents are intended to cover such forms or modifications as would fall within the scope and spirit of the inventions.

What is claimed is:

1. A method for manufacturing a semiconductor device, comprising:
    forming a second semiconductor layer of a first conductivity type on a first semiconductor layer of the first conductivity type;
    forming a trench in the second semiconductor layer;
    forming a first conductive film in the trench through a first insulating film so as to bury the trench;
    removing the first insulating film of the upper portion of the trench on an opening side of the trench;
    oxidizing the side surface of the upper portion of the exposed trench and the entire upper portion of the exposed first conductive film so as to form a gate insulating film and a second insulating film;
    forming a gate electrode between the gate insulating film and the second insulating film;
    forming a third semiconductor layer of the second conductivity type in the upper portion of the second semiconductor layer; and forming a fourth semiconductor layer of the first conductivity type in the upper portion of the third semiconductor layer.

2. The method for manufacturing the semiconductor device according to claim 1, wherein the gate insulating film of the target thickness is obtained simultaneously with or after the oxidation of the entire upper portion of the first conductive film.

3. The method for manufacturing the semiconductor device according to claim 1, wherein the side surface of the upper portion of the exposed trench and the upper portion of the exposed first conductive film are thermally oxidized by hydrogen burning oxidation.

4. The method for manufacturing the semiconductor device according to claim 3, wherein hydrogen burning oxidation is performed at a temperature of about 800° C. to about 900° C.

5. The method for manufacturing the semiconductor device according to claim 3, wherein a ratio of an oxidation rate of the first conductive film to an oxidation rate of the second semiconductor layer is 4 or more.

6. The method for manufacturing the semiconductor device according to claim 1, wherein the side surface of the upper portion of the exposed trench and the upper portion of the exposed first conductive film are thermally oxidized by steam oxidation.

7. The method for manufacturing the semiconductor device according to claim 1, further comprising:
   forming a fifth semiconductor layer of the second conductivity type so as to reach the third semiconductor layer through the fourth semiconductor layer.

\* \* \* \* \*